United States Patent [19]

Janesick

[11] Patent Number: 5,077,592
[45] Date of Patent: Dec. 31, 1991

[54] FRONT-ILLUMINATED CCD WITH OPEN PINNED-PHASE REGION AND TWO-PHASE TRANSFER GATE REGIONS

[75] Inventor: James R. Janesick, La Canada, Calif.
[73] Assignee: California Institute of Technology, Pasadena, Calif.
[21] Appl. No.: 563,559
[22] Filed: Aug. 6, 1990
[51] Int. Cl.[5] .................. H01L 29/78; H01L 27/14; H01L 29/34
[52] U.S. Cl. ........................ 357/24; 357/30; 357/54; 377/60; 377/61; 377/62; 358/213.31
[58] Field of Search ............... 357/24 M, 24 LR, 24, 357/54, 30 D, 30 F, 30 H; 377/60, 61, 62; 358/213.31

[56] References Cited

U.S. PATENT DOCUMENTS

| | | | |
|---|---|---|---|
| 4,498,013 | 2/1985 | Karoda et al. | 357/24 LR |
| 4,649,407 | 3/1987 | Kitamura et al. | 357/24 LR |
| 4,742,381 | 5/1988 | Fujii | 357/24 LR |
| 4,760,031 | 7/1988 | Janesick | 437/3 |
| 4,798,958 | 1/1989 | Janesick et al. | 250/370.01 |
| 4,814,844 | 3/1989 | Bluzer | 357/24 M |
| 4,814,848 | 3/1989 | Akimoto et al. | 357/24 LR |
| 4,822,748 | 4/1989 | Janesick et al. | 437/3 |
| 4,851,870 | 7/1987 | Miyatake | 357/24 LR |
| 4,992,841 | 2/1991 | Halvis | 357/24 M |

FOREIGN PATENT DOCUMENTS 2026769 2/1980 United Kingdom ........... 357/24 LR

Primary Examiner—Andrew J. James
Assistant Examiner—Ngan Van Ngo
Attorney, Agent, or Firm—A. M. Fernandez

[57] ABSTRACT

A front-illuminated CCD of relative high quantum efficiency (QE) and high charge transfer efficiency (CTE) utilizes an open-phase region for receiving photons and two-phase gate regions ($\phi_1$ and $\phi_2$) for transferring electrons collected in one pixel to the next. The open-phase region is implanted with additional n-type elements (phosphorus) in order to increase the potential of the CCD channel in the open-phase region for collection of electrons and additionally implanted with concentrated and very shallow p-type elements (boron) to pin the surface of the n-channel in the open-phase region to 0V, while gate region $\phi_1$ and $\phi_2$ are biased to $-3.5$V and driven to $+10$V by a two-phase transfer clock. The open pinned-phase (OPP) region thus permits two-phase transfer clocking and optimum reception of photons during the integration periods between transfer clock pulses.

7 Claims, 3 Drawing Sheets

FRONT-ILLUMINATED CCD WITH OPEN PINNED-PHASE REGION AND TWO-PHASE TRANSFER GATE REGIONS

ORIGIN OF THE INVENTION

The invention described herein was made in the performance of work under a NASA contract, and is subject to the provisions of Public Law 96-517 (35 USC 202) in which the Contractor has elected to retain title.

TECHNICAL FIELD

The invention relates to charge-coupled devices (CCDs) and more particularly to front-illuminated CCDs of relatively high quantum efficiency (QE) and high charge transfer efficiency (CTE).

BACKGROUND ART

Multiphase charge-coupled devices (CCDs) have exhibited poor sensitivity in the blue, UV, and soft x-ray bands due to the absorbing polysilicon layers associated with the transfer gate structure of the CCDs. To avoid the gate problem, it has been necessary to either deposit UV sensitive organic phosphor coatings, e.g., coronene or lumagen [J. Janesick, et al., "Charge-Coupled Device Pinning Technologies," Optical Sensors and Electronic Photography, M. Blouke, D. Pophal eds., Proc. SPIE 1071, pp. 153-169, January 1989] onto the gate structure or thin the back side of the CCD in order to be able to illuminate the sensor through the back, as described in U.S. Pat. Nos. 4,760,031; 4,798,958; and 4,822,748.

Virtual-phase CCD technology has resolved the QE problem of the front illuminated CCD by leaving half of the pixel area "open," i.e., uncovered by polysilicon layers associated with the gate structure of the CCD. Such a large open area is made possible by employing a virtual electrode for one phase of the multiphase CCD, thus allowing photons to enter the photosensitive silicon of the CCD unimpeded. [J. Janesick, et al., "Virtual Phase Imager for Galileo," Solid State Imagers for Astronomy, J. Gary and D. Latham eds., Proc. SPIE 290, pp. 165-173, June 1981, and J. Janesick, et al., "Scientific Charge-Coupled Devices," Optical Engineering, 26(8), pp. 692-714, August 1987.]

Single clock operation is an important feature of virtual-phase CCD technology. Unfortunately, many CTE problems are associated with multiphase CCDs. Some have been solved by manipulating the clock phases to collapse potential pockets located in the signal channel. But for virtual-phase CCDs many of the potentials are defined by implants not external gates, so the user cannot control them to achieve optimum performance. This inflexibility has often proved to be a disadvantage for low-signal applications.

The CTE problem has been traced to spurious potential pockets which trap charges in the signal transfer channel because of improper potential well shape and/or depth of a pixel. [J. Janesick, et al., "Scientific Charge-Coupled Devices," Optical Engineering, 26(8), pp. 692-714, August 1987.]

Alignment of implants for potential well shape is crucial for the virtual-phase CCD technology to work, and small misalignments often create potential pockets (or bumps) which degrade CTE. To overcome the problem, it has been the practice to add a background charge which fills the pockets allowing signal charge to transfer over the troubled areas. But this practice incurs the penalty of increased noise associated with the shot noise of this added background charge.

The CTE problems associated with the virtual-phase CCDs are most conspicuous in the horizontal register because this register is clocked at a faster rate than the vertical registers which make up the array. Also, the horizontal register of the CCD is usually made larger to accommodate pixel summation, resulting in larger spurious pockets.

Virtual-phase CCDs are also afflicted with another problem, a phenomenon referred to as "spurious charge." [J. Janesick, et al., (1981) and J. Janesick, et al., (1987)] Although the noise level of the virtual-phase on-chip amplifier has been measured to be less than 10 electrons rms, the noise floor for many virtual-phase sensors is typically limited to about 30 electrons due to the production of small quantities of unwanted charge within each pixel as a result of clocking operation. During charge transfer from the clocked region to the virtual region, the surface beneath the gate of each pixel becomes inverted (i.e., holes from the channel stop regions migrate beneath the gate and pin the surface potential at substrate potential). Some of the holes become trapped in sites along the Si—SiO$_2$ interface with sufficient energy to create electron hole pairs in the silicon by means of impact ionization. These spurious charge electrons are then collected in the nearest potential well. Since this process occurs each time charge is transferred, the amount of charge collected increases linearly with the number of transfers. Interestingly the noise that is produced is characterized as shot noise (i.e., noise that increases by the square root of the spurious signal generated).

Spurious charge grows exponentially with clock swing and the slew rate of the rising edge of the clock. Spurious charge generation is substantially greater in the horizontal register than the vertical registers solely because the horizontal clocks rise at a faster rate. Vertical spurious charge is controlled by simply wave-shaping the rising edge of the clock. However, other clocking schemes, such as tri-level clocking, [J. Janesick, et al. (1987)] must be used to control the amount of spurious charge generated in the horizontals. Nevertheless, the read noise floor of the detector is still limited. It should be mentioned that spurious charge generation acts as a background charge signal and can improve the CCDs apparent CTE. In fact, some virtual-phase users find this property advantageous and purposely allow some spurious charge to be generated, despite an associated increase in readout noise.

STATEMENT OF THE INVENTION

An object of this invention is to provide a large open area in a CCD for front illumination with both high QE and CTE and with low readout noise. These and other advantages are achieved in a CCD by having an array of pixels and a two-phase gate structure comprised of two adjacent gates for each pixel on one surface of the CCD for transfer of collected electrons from each pixel to a neighboring pixel, that one surface being the surface of the array of pixels through which photons enter the CCD to collect the photon generated electrons. Each pixel is comprised of a substrate, a layer of semiconductor material on the substrate doped with elements that are n-type in the semiconductor material to form an n-channel layer, an oxide film between said two-phase gate structure and the n-channel layer, an open-phase region on the surface of the n-channel layer between the two-phase gate structure of one pixel and the two-phase gate of a neighboring pixel in the array. The open-phase region of each pixel is implanted to a depth substantially equal to the thickness of the n-channel with n-type elements in order to increase the potential in the n-channel to produce a well for collection of electrons generated by photons received through the open-phase region. The open-phase region is provided with a further implant made through the surface thereof with p-type elements, the second implant being concentrated and very shallow, to pin the surface of the open-phase region to zero volts, thereby providing an open pinned-phase region. For transferring collected electrons from one pixel to the next, means are provided for applying separately a two-phase clock to said two gates of each pixel to successively drive the two gates in overlapping phase from a bias potential that is negative relative to the pinned surface potential of the open pinned-phase region to a potential that is positive relative to the pinned surface potential and then back to the bias potential for transfer of collected electrons from a well in an open pinned-phase region of one pixel to a well in an open pinned-phase region of a neighboring pixel while the surface of the open pinned-phase region remains pinned to a fixed reference potential.

The two adjacent gates for each pixel of the two-phase gate structure is comprised of two parallel gates, a first gate for providing a deep well for receiving collected electrons being transferred from the open pinned-phase region of one pixel upon the first gate being driven to a positive potential during a first part of the two phase transfer clock, a second gate for providing a deep well to share with the well of the first gate collected electrons being transferred during a second part of the two-phase transfer clock and for receiving all of the electrons being transferred during a third part of the two-phase clock upon the first gate being returned to the negative bias potential, whereby upon the second gate being returned to the negative bias potential during a fourth part of the two-phase transfer clock, the electrons being transferred are caused to flow into the open pinned-phase region of the neighboring pixel. The second gate overlaps the first gate for smooth transfer of electrons between the gate regions, but is electrically insulated from the first gate. The substrate material is preferably silicon and the first and second gates are electrically insulated from each other and from the n-channel by polysilicon deposited over a thin layer of nitride on the n-channel covered by a thin layer of oxide on the nitride layer. The surface of the open pinned-phase region is coated with a thin protective oxide film, and the open pinned-phase region is at least equal to the area of the pixel occupied by the two-phase gate structure.

The novel features that are considered characteristic of this invention are set forth with particularity in the appended claims. The invention will best be understood from the following description when read in connection with the accompanying drawings.

DETAILED DESCRIPTION OF THE INVENTION

Figure 1:
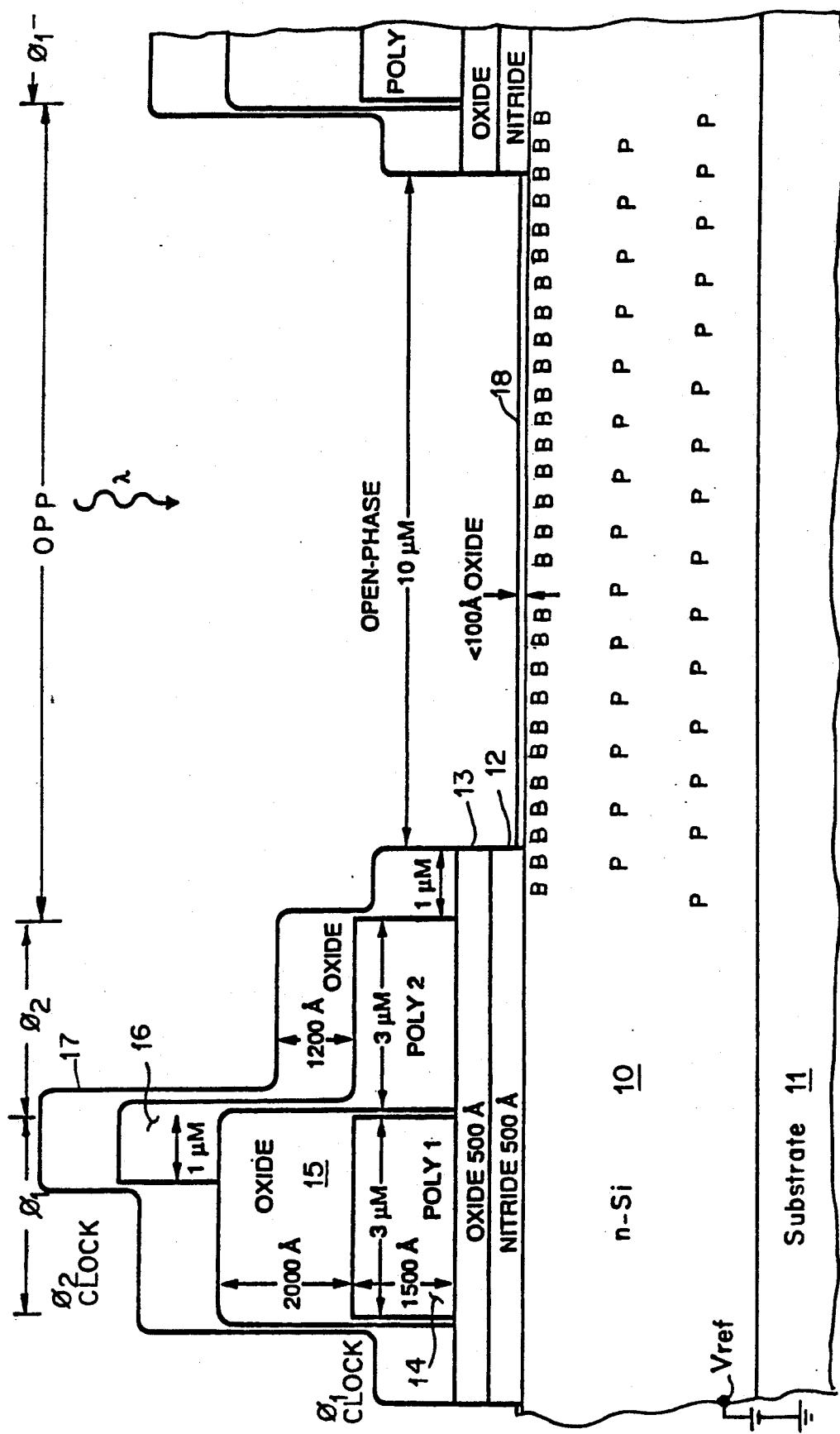
FIG. 1 illustrates a cross section of an open pinned-phase pixel of a CCD.

Referring to FIG. 1, it shows a cross section of an open pinned-phase pixel of a CCD pixel array comprised of an n-channel 10 of silicon epitaxially grown on a substrate 11 and divided into three regions: two clocked regions defined as phase $\phi_1$ and phase $\phi_2$ gate regions, and an open pinned-phase region OPP. This CCD array is fabricated using the same process as a three-phase CCD, except that a third level of doped polysilicon is intentionally omitted, and only two levels of doped polysilicon are used for the gates. For convenience of illustration, the vertical scale of the drawing is ten times the horizontal scale. The first layer (POLY 1) is partially overlapped by the second layer (POLY 2).

A thin nitride film 12 is first deposited and then insulated with a thin oxide film 13. Next a first patterned layer 14 of doped polysilicon (POLY 1) is deposited to form a first phase $\phi_1$ conductive gate region and then insulated with an oxide coating 15. Then a second patterned layer of doped polysilicon 16 is deposited to form a second conductive gate $\phi_2$ region and insulated with an oxide coating 17. A gap filled with oxide results between the POLY 1 and POLY 2 layers at the surface of the oxide 13 but a substantial overlap of the POLY 2 over the surface of POLY 1 is provided to aid in the transfer of stored charge from the open-phase region of one pixel into the open-phase region of the next pixel to the right as viewed in FIG. 1. For ease of understanding a description of the transfer operation, the first and second phase gate regions $\phi_1$ and $\phi_2$ are to be considered as those comprised of just the horizontal surfaces of the POLY 1 and POLY 2 on the oxide layer 13 without a gap.

In place of the third phase gate of a three-phase CCD, two implants are incorporated in the open-phase region. The first implant of n-type doping material, e.g., phosphorus (P), adds more n-type doping to the n-channel 10 in order to increase the potential for signal charge to collect. The second implant, a concentrated but very shallow implant of p-type doping, e.g., boron (B), pins the surface potential to zero volts at the interface between a very thin oxide film 18 and the n-channel 10 in the open phase region to provide an open pinned-phase region OPP. Both implants are self-aligned by the polysilicon deposits POLY 1 and POLY 2. This implant is similar to the pinning implant employed in the virtual phase region of a virtual-phase CCD. The pinning implant acts as a virtual gate maintaining a fixed surface potential within the open pinned-phase region OPP.

Figure 2:
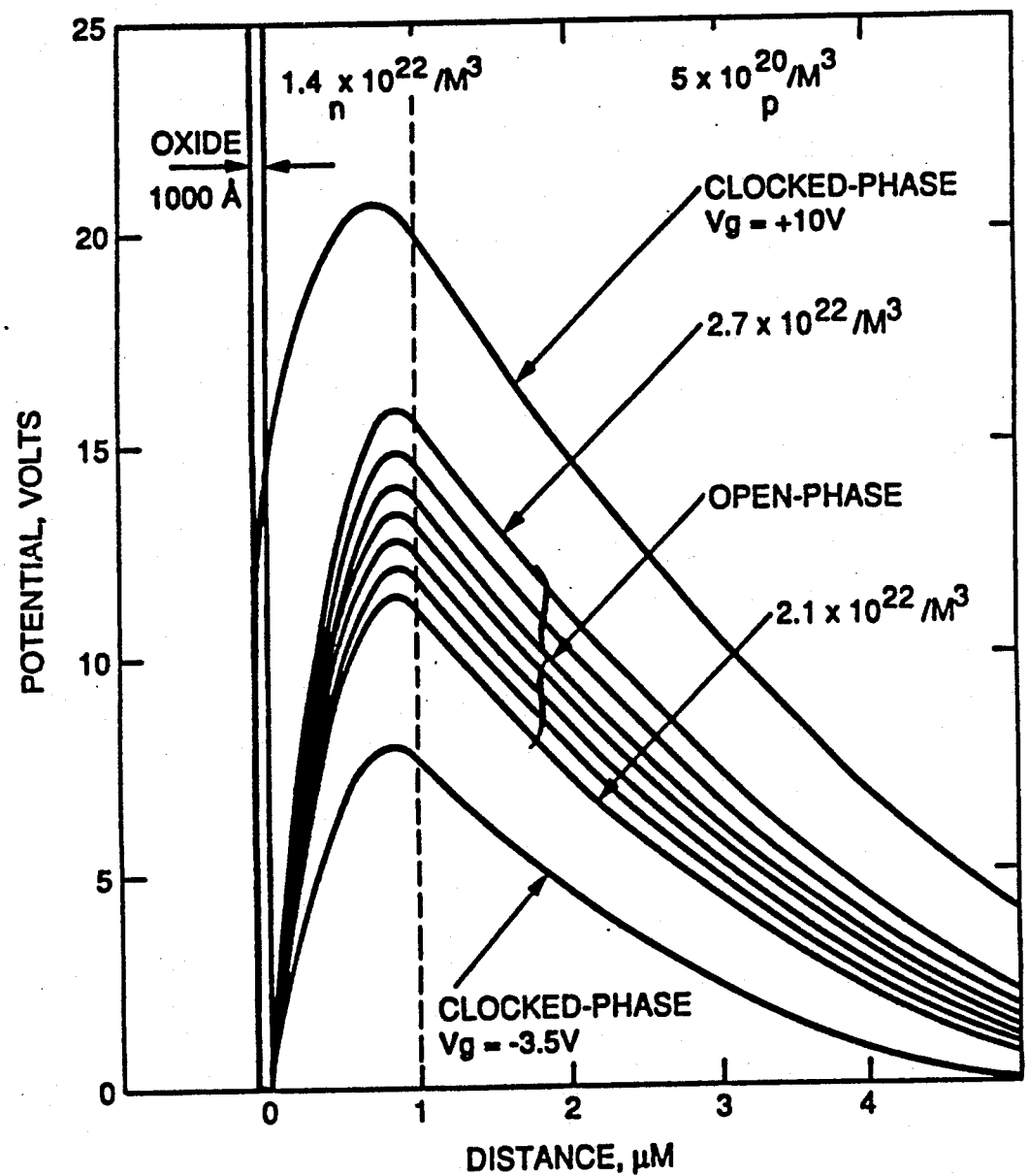
FIG. 2 is a plot of potentials for an open pinned-phase pixel shown in FIG. 1.

FIG. 2 plots potential as a function of distance into the CCD pixel of FIG. 1 from the front (illuminated) side through the open-phase region. The plots are for both the clocked-phase regions $\phi_1$ and $\phi_2$ and for the open-phase region. Electrons collect in a region of local potential maximum (energetically a minimum for an electron). During charge integration, phase $\phi_1$ and phase $\phi_2$ gates are held at a potential that is negative with respect to open-phase region, such as at $-3.5$ volts, thus forcing integration (collection) of electrons to take place within the open-phase region. While biased in this condition, the surface potential of the POLY 1 and POLY 2 clocked-phase regions over the n-channel assume ground potential (i.e., 0 V), causing the n- channel 10 to invert with free holes which are supplied from p+ grounded channel-stop regions (not shown) which run on both sides of each linear array of pixels in the CCD (i.e., run in front of and in back of the paper relative to the cross section of FIG. 1).

The open-phase region is shown as having progressively less positive plots as electrons are accumulated, while the POLY 1 and POLY 2 regions are shown to have two clocked-phase plots, one for the clocked phase of the gates at $V_g = -3.5$ V, and another for the clocked phase of the gates at $V_g = +10$ V.

Figure 3:
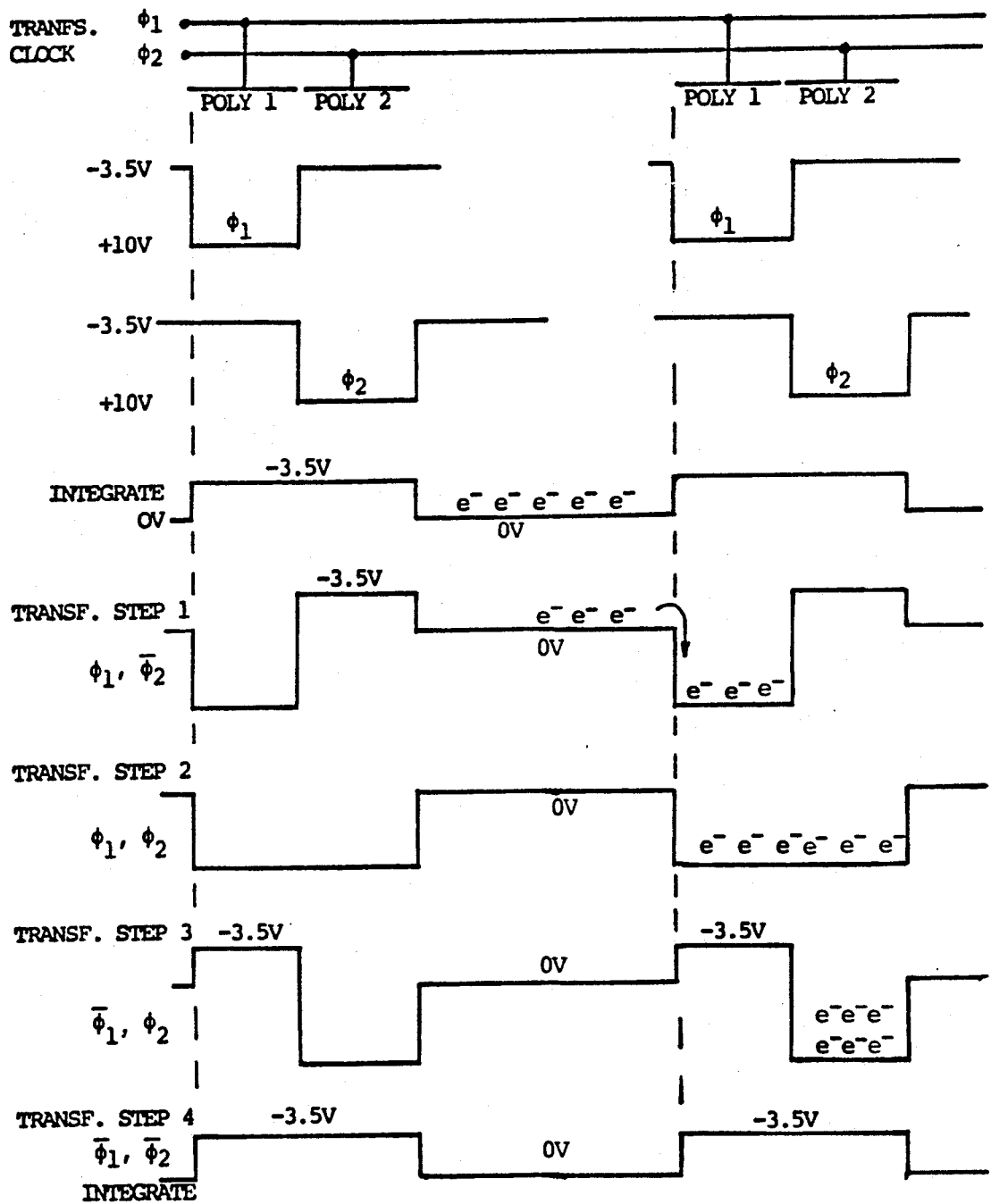
FIG. 3 is a diagram which shows along the horizontal axis a spatial distribution of applied voltages in response to a two-phase transfer clock (pulses $\phi_1$ and $\phi_2$) at sequential intervals of a transfer clock time designated $\bar{\phi}_1$, $\phi_2$; $\bar{\phi}_1$, $\bar{\phi}_2$; $\phi_1$, $\bar{\phi}_2$; and $\phi_1$, $\phi_2$.

Charge transfer for the electrons accumulated in the open-phase region is to the right as viewed in FIG. 1, although for transfer in the opposite direction it is necessary to merely reverse the phase of the transfer clock pulses $\phi_1$ and $\phi_2$ shown in FIG. 3. In transferring charge to the open-phase region of the next pixel, the first phase pulse $\phi_1$ of a two-phase clock drives the phase gate $\phi_1$ between the open-phase regions to $+10$ V to cause the accumulated electrons to drop into the region of the n-channel beneath the POLY 1 region of the next pixel while the phase gate $\phi_2$ of the next pixel is held at $-3.5$ V to act as a barrier to assure that no electrons flow backward from the open-phase region of the next pixel to the phase $\phi_1$ region of that pixel. When the second phase pulse $\phi_2$ of the transfer clock is present, the phase gate $\phi_2$ of the next pixel is driven to $+10$ V and the transferred electrons occupy both POLY 1 and POLY 2 regions of the n-channel 10. The first phase pulse $\phi_1$ of the transfer clock remains positive for half the period of the second phase pulse $\phi_2$, as shown by the timing graph in FIG. 3. The first phase pulse $\phi_1$ is then returned to $-3.5$ V which forces all transferred electrons into the POLY 2 region of the next pixel followed by the second phase pulse $\phi_2$ being returned to $-3.5$ V. As the second phase pulse $\phi_2$ reaches 0 V while it is being returned to $-3.5$ V, the electrons being transferred flow into the open-pinned phase region of the next pixel thus completing a two-phase clock transfer cycle.

Referring to FIG. 2 in more detail, it shows various doping levels. The substrate 11 is doped with boron to a level of $5 \times 10^{20}$ per cubic meter while the n-channel 10 is doped with phosphorus to a level of $1.4 \times 10^{22}$ per cubic meter, but the potential plots shown for the clocked phase pulses $\phi_1$ and $\phi_2$ are established by the separate levels of $-3.5$ V and $+10$ V. The potential plots for the open-phase region are for various doping levels of phosphorus in the buried channel 10 ranging from $2.1 \times 10^{22}$ to $2.7 \times 10^{22}$ per cubic meter, any one of which may be selected. Thus, for the CCD parameters used in the model of a preferred embodiment, the open-phase region requires a phosphorus doping level of about two times the doping level of the clocked-phase regions, namely between $2.1 \times 10^{22}$ and $2.7 \times 10^{22}$ per cubic meter, as compared to $1.4 \times 10^{22}$ per cubic meter in the n-channel outside the open-phase region. This will position the open pinned-phase region OPP between the two clocked states (assuming inversion at the interface of the n-channel and the two clocked regions, and a $+10$ V two-phase transfer clock). Such a position will produce the best full well capacity. The shallow and more dense implants of boron at the interface of the n-channel with the thin oxide ($<100$ Å) 18 in the open-phase region is sufficient to pin the interface to 0 volt.

There are a number of unique design features of the present CCD. As pointed out above, the horizontal register of a virtual-phase CCD typically exhibits low-level CTE and spurious charge generation difficulties. Because three-phase technology has shown superior performance in the areas of CTE and read noise, the horizontal register used to transfer data from a bottom row of pixels, after each transfer in parallel of vertical columns of data in the CCD, one pixel position will be fabricated using conventional three-phase technology (i.e., the third layer of poly is employed). The vertical registers of the array will utilize the technology of the present invention solely for improved QE. Designed this way, the horizontal pixel can be clocked noninverted (thereby circumventing spurious charge generation), and the vertical pixel arrays can be run inverted (thereby resulting in low dark current generation).

To achieve optimum QE, the open-phase region is designed as large as possible. However, as the open phase is made larger, phases 1 and 2 must be made smaller to accompany a given pixel size. Full well capacity of a pixel is limited to the quantity of charge that can be held by an individual clock phase or the open region. Therefore, in the technology of the present invention there is a direct trade-off between well capacity and QE. For example, three different types of CCDs have been designed in accordance with the present invention with 3-microns allocated for each clocked phase and 12-microns for the open phase. Such a configuration yields an overall pixel size of 18-microns. Although QE performance has been maximized for this device, full well will be relatively low at approximately 100,000 electrons. The 3-3-12 sensor was designed specifically for soft x-ray and low-level astronomical applications where well capacity is usually secondary to QE. Two other general purpose CCDs have been designed: a 5-5-5, 15-micron pixel and a 6-6-6, 18-micron pixel.

In order for the present CCD to respond to wavelengths of less than 200 Å, it will be necessary to remove the protective over-coat glass as well as the gate insulator (oxide 12 and nitride 13) within the open-phase region. By etching these layers to the silicon surface and providing a thin thermal oxide ($<100$ Å) as shown in FIG. 1, the CCD should respond over the entire silicon range covering 1–11,000 Å (i.e., from the soft x-ray to the near IR). Further improvement in QE can be achieved by the utilization of antireflection coatings over the oxide film 18.

As described in FIG. 2, in transferring charge from the open phase to the clocked phase regions, it was necessary to bring each phase region out of inversion. When noninverted, dark current generation increases significantly from the surface states at the Si—SiO$_2$ interface. Fortunately the duty cycle of the vertical clocks are such that the noninverted condition exists only briefly because the horizontal register must be read out between vertical line transfer times. During this time, the vertical clocks are quickly brought back into the inverted state maintaining low dark current generation.

Miscellaneous features of the CCD provide additional advantages. The CCD is a bidirectional transfer CCD so that charge can be transferred up or down the array depending on clock phasing. The two vertical phases can be delayed with respect to each other such that either operation can be utilized if desired. Unlike most backside illuminated CCDs, the present CCD will exhibit excellent CCD performance in the UV, EUV and soft x-ray since photogenerated electrons collect directly in the open-phase potential wells without charge diffusion. It remains to be seen if the present CCD will be plagued with the dark spike generation problem experienced by virtual-phase devices. The general consensus indicates that this will not be the case because the pinning implant used in the open pinned-phase region is not as concentrated as that used in virtual-phase technology (i.e., the internal fields should be lower).

It should be emphasized the present CCD is not intended to replace the backside-illuminated CCD since their images will always, at least in theory, achieve higher sensitivity and charge collection efficiency than can be delivered by the present CCD. However, the present CCD will deliver a modest short-wavelength QE and excellent CCD characteristics much like that of the virtual-phase CCD without requiring expensive processes related to thinning, backside accumulation and packaging. Likewise, the present CCD will not replace the virtual-phase CCD, for this technology also has a position in the imaging community (mostly commercial). However, the present CCD promises to solve most problem areas identified with virtual-phase technology, especially those areas critical to low-level imaging applications. In addition, the open pinned-phase technology of the present invention is closely related to three-phase technology, which permits those equipped to fabricate multiphase CCDs to fabricate open pinned-phase CCDs without significant change in their processing capabilities.

Although particular embodiments of the invention have been described and illustrated herein, it is recognized that modifications and variations may readily occur to those skilled in the art. Consequently, it is intended that the claims be interpreted to cover such modifications and variations.

What is claimed is:

1. A charge-coupled device having an array of pixels and a two-phase gate structure comprised of two adjacent gates for each pixel on one surface of said device for transfer of collected electrons from each pixel to a neighboring pixel, said one surface being the surface of said array of pixels through which photons enter said device to generate said collected electrons, each pixel being comprised of a substrate,
   a layer of semiconductor material on said substrate doped with elements that are n-type in said semiconductor material to form an n-channel layer,
   an electric insulator film between said two-phase gate structure and said n-channel layer,
   an open-phase region on the surface of said n-channel layer between the two-phase gate structure of one pixel and the two-phase gate of a neighboring pixel in said array, said open-phase region of each pixel being implanted to a depth substantially equal to the thickness of said n-channel with n-type elements in order to increase the potential in said n-channel to produce a well for collection of electrons generated by photons received through said open-phase region, said open-phase region having a further implant made through the surface thereof with p-type elements, said second implant being concentrated and very shallow to pin the surface of said open-phase region to zero volts, thereby providing an open pinned-phase region, and
   means for applying separately a two-phase clock to said two gates of each pixel for successively driving said two gates in overlapping phase from a bias potential that is negative relative to said pinned surface potential of said open pinned-phase region to a potential that is positive relative to said pinned surface potential and then back to said bias potential for transfer of collected electrons from a well in an open pinned-phase region of one pixel to a well in an open pinned-phase region of a neighboring pixel while said surface of said open pinned-phase region remains pinned to a fixed reference potential.

2. A charge-coupled device as defined in claim 1 wherein said two adjacent gates for each pixel of said two-phase gate structure is comprised of two parallel gates, a first gate for providing a deep well for receiving collected electrons being transferred from said open pinned-phase region of one pixel upon said first gate being driven to said positive potential during a first part of said two phase transfer clock, a second gate for providing a deep well to share with said well of said first gate collected electrons being transferred during a second part of said two-phase transfer clock and for receiving all of said electrons being transferred during a third part of said two-phase clock upon said first gate being returned to said negative bias potential, whereby upon said second gate being returned to said negative bias potential during a fourth part of said two-phase transfer clock, the electrons being transferred are caused to flow into said open pinned-phase region of said neighboring pixel.

3. A charge-coupled device as defined in claim 2 wherein said second gate overlaps said first gate, but is electrically insulated from said first gate.

4. A charge-coupled device as defined in claim 3 wherein said substrate material is silicon and said first and second gates are electrically insulated from each other and from said n-channel by doped polysilicon deposited over a thin layer of nitride on said n-channel covered by a thin layer of oxide on said nitride layer.

5. A charge-coupled device as defined in claim 1 wherein said surface of said open pinned-phase region is coated with a thin protective oxide film.

6. A charge-coupled device as defined in claim 1 wherein said open pinned-phase region is at least equal to the area of said pixel occupied by said two-phase gate structure.

7. A front-illuminated charge-coupled device of relative high quantum efficiency and high charge transfer efficiency, said charge-coupled device having an array of pixels in a semiconductor body doped with n-type elements to provide an n-channel common to all pixels, each pixel having an open-phase region and a pair of two-phase gate regions adjacent to each other, said open-phase region being a region of said semiconductor body having an unobstructed surface through which incident photons are received, said open-phase region of said semiconductor body of each pixel being implanted with additional n-type elements in order to increase the potential of said n-channel in said open-phase region of said semiconductor body for collection of electrons in response to photons received through said surface of said semiconductor body across said open phase region, and additionally implanted with concentrated and very shallow p-type elements to pin said unobstructed surface of said semiconductor body across said open-phase region of each pixel to 0 V, whereby said open-phase region receives photons in said semiconductor body and stores electrons produced by said photons, means for biasing said pair of two-phase gate regions to $-3.5$ V, and means for separately driving said pair of two-phase gates of each of said pixels from $-3.5$ V to $+10$ V by two-phase transfer clock pulses for clocking said pair of two-phase gate regions of each pixel in sequence in order to transfer integrated electrons in either direction, depending solely upon the phase relationship of said two-phase transfer clock pulses.

* * * * *